United States Patent

[11] 3,629,738

[72] Inventor George A. Senf
Williamstown, Mass.
[21] Appl. No. 42,414
[22] Filed June 1, 1970
[45] Patented Dec. 21, 1971
[73] Assignee Sprague Electric Company
North Adams, Mass.
Continuation-in-part of application Ser. No. 730,026, May 17, 1968. This application June 1, 1970, Ser. No. 42,414

[54] MICROSTRIP DELAY LINE
6 Claims, 4 Drawing Figs.

[52] U.S. Cl. .......... 333/30, 333/84 M, 333/73 S
[51] Int. Cl. .......... H03b 7/30
[50] Field of Search .......... 333/70, 84 M, 73, 30; 317/101; 174/113; 343/806

[56] References Cited

UNITED STATES PATENTS

| | | | |
|---|---|---|---|
| 3,173,111 | 3/1965 | Kallman | 333/29 |
| 3,436,687 | 4/1969 | Andrews | 333/29 |
| 2,751,558 | 6/1956 | Grieg et al. | 333/73 S |
| 2,688,119 | 8/1954 | Gere | 333/5 |
| 2,768,357 | 10/1956 | Lyons | 333/82 |

*Primary Examiner*—Herman Karl Saalbach
*Assistant Examiner*—C. Baraff
*Attorneys*—Connolly and Hutz and Vincent H. Sweeney

ABSTRACT: An effective ground plane pattern adjusted for minimum phase distortion is provided for a microstrip delay line by varying the distances between shorting bars which interconnect conductive strips spaced apart so as to encompass the entire ground plane area.

MICROSTRIP DELAY LINE

CROSS-REFERENCE TO RELATED APPLICATION

The present invention is a continuation-in-part of copending application Ser. No. 730,026 filed in the name of George A. Senf on May 17, 1968.

BACKGROUND OF THE INVENTION

This invention relates to microstrip delay lines and in particular to a parallel plate microstrip delay line having a ground plane of a readily variable pattern so as to facilitate adjustment of characteristic impedance and phase distortion.

The rapid advancement in the field of high-speed digital integrated circuits has produced a requirement for miniaturized delay lines having the requisite high frequency characteristics. A response to this need has been the parallel plate microstrip delay line which is essentially a parallel plate transmission line wherein an "active" inductance line is separated from a parallel ground line by a dielectric material. The active line comprises a series inductance that is formed by deposition of a conductive spiral on one surface of a ceramic substrate. A distributed shunt capacitance is provided by a conductive ground plane deposited on the opposing substrate surface and in proximate capacitive relation to the spiral. The conductors are deposited by printing techniques well known in integrated and thick film circuit technology.

The microstrip line meets the high frequency requirements by providing time delays up to 10 nsec. (on ½-inch cubes), delay to rise time ratios of up to 5:1 and characteristic impedances of 25 to 100 ohms. In addition, these lines are of small bulk and weight and can be economically manufactured in quantity. Delay line performance parameters for these lines are normally controlled, for a given dielectric, by varying the inductor spiral length and pitch and/or the dielectric thickness.

Phase distortion has been controlled in conventional distributed delay lines by capacitively shunting portions of the coil with longitudinal conductive patches. However, these methods are not readily adapted to microstrip delay lines.

Therefore it is an object of this invention to provide microstrip delay lines that may be readily adjusted for minimum phase distortion at high frequencies.

It is a further object of this invention to provide additional means for varying the characteristic impedance of delay lines without substantial changes in delay times.

SUMMARY OF THE INVENTION

Broadly, a delay line constructed in accordance with this invention comprises a distributed series inductance formed as a conductive spiral on the surface of a ceramic substrate and a distributed series capacitance provided by depositing a readily adjustable conductive ground plane pattern on the opposing substrate surface and in proximate capacitive relation to the spiral.

In a more limited sense, the ground plane pattern comprises a series of uniformly spaced-apart and parallel conductive strips which encompass the surface area directly opposing the perimeter of the distributed inductance pattern, and at least two parallel and spaced-apart shorting bars crossing the conductive strips and in electrical contact with the conductive strips wherein the spacing between the shorting bars is selected so as to achieve minimum phase distortion. The effective ground area of the group plane pattern may be varied by adjusting the widths of the conductive strips and shorting bars thereby causing a corresponding change in the characteristic impedance of the line.

DESCRIPTION OF THE INVENTION

Figures 1, 2, 3, 4:
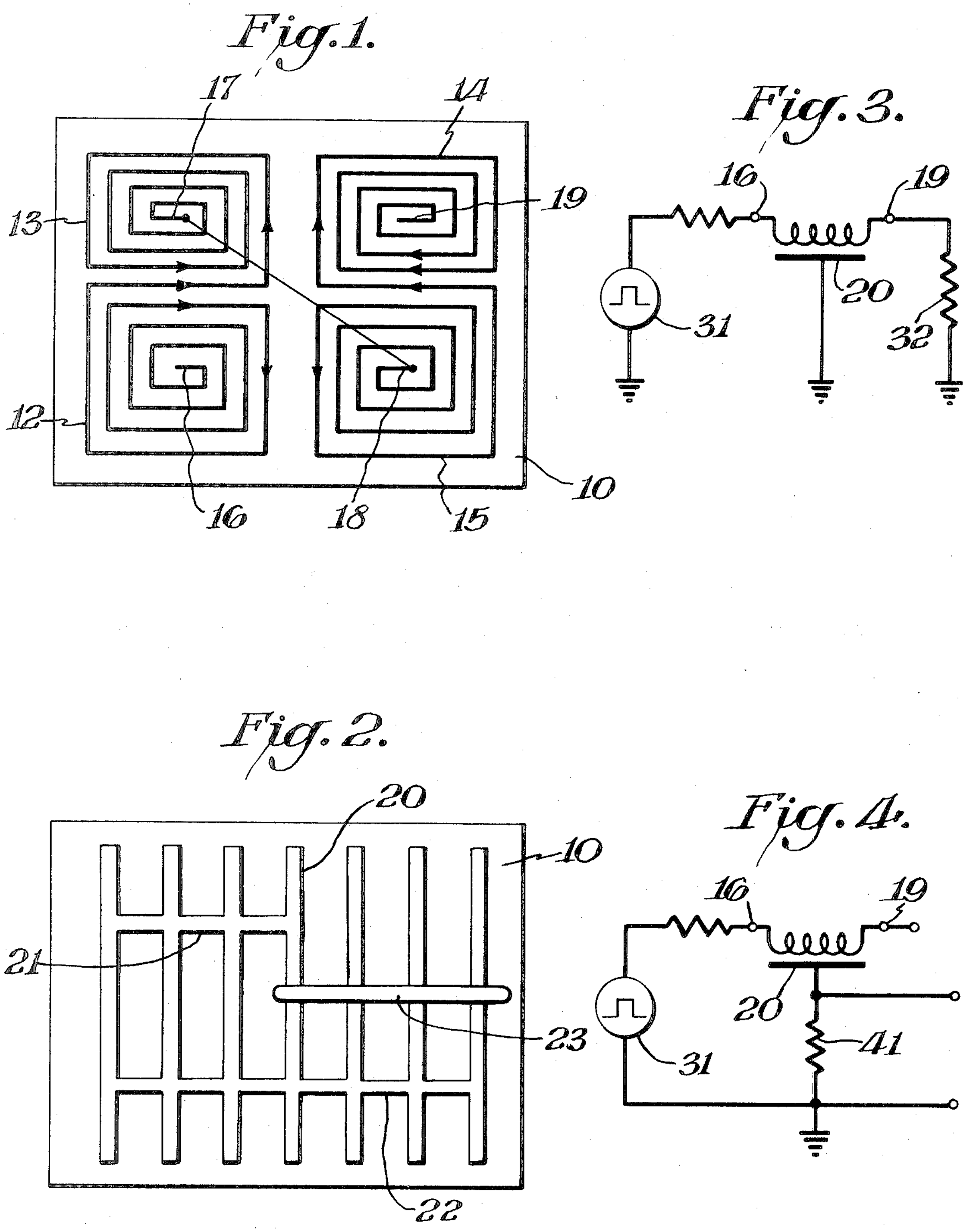
FIG. 1 shows 4 distributed inductance spiral patterns disposed on a dielectric substrate so as to form a microstrip delay line.
FIG. 2 shows a ground plane pattern on the opposing surface of the substrate of FIG. 1.
FIG. 3 shows a typical network application for the delay line of FIGS. 1 and 2.
FIG. 4 shows the delay line of FIGS. 1 and 2 connected in a pulse-forming network.

FIGS. 1 and 2 show one embodiment of a microstrip delay line formed in accordance with this invention. FIG. 1 shows the series inductance of the active line which is formed by screening spirals 12, 13, 14 and 15 onto the surface of substrate 10. FIG. 2 shows the ground plane pattern 20 of this invention which is screened onto the opposing surface of the substrate. The input pulse is applied between terminal 16 and the ground plane with the four inductive conductive spirals connected in series enchancing mode so that all currents in opposing spirals flow in the same directions thereby eliminating any flux bucking between the spirals. The spiral design including the number of turns and segment width together with substrate qualities such as permittivity and strength are determined by particular design requirements.

The ground plane of the delay line shown in FIG. 2 consists of a series of uniformly spaced parallel conductive strips 20 distributed along the length and width of the active line, thus affording a characteristic impedance along the length of the line. Conductive shorting bars 21, 22 and 23 are attached to the conductive strips 20 so as to provide a ground plane pattern. The width of the conductive strips and the shorting bars may be varied so as to change the effective conductive area encompassed within the spiral perimeters. By increasing the effective conductive area of the ground plane, the characteristic impedance of the delay line is correspondingly decreased together with a decrease in rise time with no substantial change in delay time. The effective conductive area of the ground plane can also be varied by changing the number of shorting bars.

Varying the position of the shorting bars changes the phase distortion of the microstrip delay line without substantially changing the characteristic impedance or rise time of the line. Also varying the number of shorting bars will cause a corresponding change in the phase distortion of the line. However, varying the number of shorting bars also causes a change in the effective surface area of the ground pattern thereby causing a corresponding change in the characteristic impedance of the line.

The shorting bars 21 and 23 of FIG. 2 are divided so that the effective ground plane patterns encompassing the areas opposite each set of inductive coils may be varied individually enabling each set of inductive coils to be tuned for phase distortion. The position of the shorting bars can be varied so as to achieve optimum dampening of the ringing at the output. Because of the complexity of the flux patterns generated and their interrelation with phase distortion, it becomes difficult to predict the optimum position for the shorting bars in order to achieve a minimum phase distortion for various delay line designs. Hence an empirical approach is required in order to design a ground area such that the desired characteristic impedance is achieved with limited phase distortion at the output.

The microstrip delay line shown in FIGS. 1 and 2 was designed for a 7 nsec. delay and the active line required the deposition of four 0.25-inch square conductive spirals 12, 13, 14 and 15 which are connected in series enhancing mode. The input to the line is applied at 16 and the output taken at 19 with points 17 and 18 coupled together by an external connection shown in FIG. 1. It can be seen from the arrows in FIG. 1 that the direction of current flow for all adjoining coils is the same so as not to cause flux bucking between the spirals. The spirals are formed by screening a thin film (0.2 to 0.4 mil) of conductive material such as silver onto the surface of temperature-compensating ceramic dielectric substrate 10. The substrate is 20 mils thick and has a dielectric constant of approximately 50 and may be composed of such materials as titanium dioxide or barium titanate. The line width of the spirals is between 5 and 10 mils and the spacing between the lines of the spirals is also between 5 and 10 mils.

The thin film (0.2 to 0.4 mil) of silver is screened onto the opposite surface of the substrate to form the ground plane pattern 20 as shown in FIG. 2. The ground plane is designed to cover 25 percent of the surface area directly opposing the perimeter of the distributed inductance pattern. Therefore, the conductive strips 20 are approximately 10 mils wide and spaced approximately 30 mils apart. Shorting bars 21 and 22 of the preferred embodiment are also screened onto the substrate as part of the pattern, while shorting bar 23 is a bus wire soldered to the ground plane pattern 20 so as to facilitate adjustment of the distance between shorting bars. The shorting bar 23 may be of copper or any other conductive material suitable for soldering to the silver strips 20.

Optimum dampening and minimum phase distortion were achieved for the 7 nsec. delay line by arranging shorting bars 21 and 22 so as to be directly opposing the central areas of the spiral inductance patterns, with shorting bus bar 23 directly opposing the area between spiral inductance pattern 14 and 15. The position of shorting bar 23 influences the flux patterns of both spirals 14 and 15, thereby achieving minimum phase distortion. The scope of the invention is by no means limited to this particular embodiment, and other ground plane patterns having more or less shorting bars with different spacings between, may also be employed.

FIG. 3 shows the microstrip delay line of FIGS. 1 and 2 resistively coupled at input 16 to a source 31 with the output 19 of the line connected to the output load resistor 32. Ground plane 20 of the delay line is shown grounded. The leading edge of an input pulse generated at source 31 would be delayed 7 nsec. by the delay line upon reaching load resistor 32. FIG. 4 shows an alternate scheme for connecting the delay line of FIGS. 1 and 2 as a pulse forming network. Source 31 is resistively coupled to input 16 of the delay line, with the output load resistor 41 coupled between the delay line ground plane 20 and the network ground. The delay time for this particular network depends upon the reflection of the input signal within the delay line and is therefore 14 nsec. which is double the delay time of the circuit of FIG. 3. The preferred embodiment of FIGS. 1 and 2 when connected into the pulse forming network of FIG. 4 exhibited a substantial dampening of ringing at the output, together with an improved fall time of from 2.4 nsec. to 2.1 nsec.

It should be understood that this invention is not limited to the four spiral design of the preferred embodiment and that it may be applied with equal success to delay lines having any number of spirals.

What is claimed is:

1. A microstrip delay line comprising a substantially planar dielectric substrate, a first electrical conductor disposed to form a distributed inductance pattern on one surface of said dielectric substrate, said inductance pattern including a plurality of conductive spirals connected in series enhancing mode, a series of spaced-apart substantially parallel conductive strips disposed to form an effective ground plane pattern on the opposing surface of said dielectric substrate in capacitive relation to said first conductor so as to encompass the surface area directly opposing the perimeter of said distributed inductance pattern, and at least two substantially parallel conductive spaced-apart shorting bars crossing said conductive strips and in electrical contact with said conductive strips with the spacing between said shorting bars determined so as to achieve minimum phase distortion, at least one of said shorting bars connecting all of said conductive strips opposing the central area between said plurality of conductive spirals.

2. The delay line of claim 1 wherein the effective conductive area of the ground plane is determined by the width of said conductive strips and said shorting bars.

3. The delay line of claim 2 wherein said shorting bars are soldered to said conductive strips.

4. The delay line of claim 2 wherein said first electrical conductor is a thin film of a conductive material screened onto the surface of a ceramic substrate in at least one spiral pattern and wherein said conductive strips are thin films of conductive material screened onto the opposing surface of the ceramic substrate over an area equal to that bounded by the spiral perimeters.

5. The delay line of claim 2 wherein said conductive strips are uniformly spaced apart and said shorting bars connect to said conductive strips at substantially right angles.

6. The delay line of claim 5 wherein said first electrical conductor is disposed to form at least four distributed inductance spiral patterns arranged in a substantially square configuration and coupled together in series enhancing mode, and said shorting bars are of a length necessary to connect all conductive strips opposing a single pair of spiral patterns.

* * * * *